(12) United States Patent
Packard

(10) Patent No.: US 6,311,224 B1
(45) Date of Patent: *Oct. 30, 2001

(54) DYNAMICALLY SELECTABLE DATA COMPRESSION TECHNIQUES BASED ON PROCESSING CAPACITY

(75) Inventor: Keith R. Packard, Portland, OR (US)

(73) Assignee: Network Computing Devices, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/314,649

(22) Filed: May 19, 1999

Related U.S. Application Data

(63) Continuation of application No. 08/792,540, filed on Jan. 31, 1997, now Pat. No. 5,964,842.

(51) Int. Cl.[7] .............................. G06F 13/00; G09G 5/00
(52) U.S. Cl. ...................... 709/247; 348/394; 348/403; 707/101
(58) Field of Search .................................... 709/247, 223; 348/394, 403; 707/101

(56) References Cited

U.S. PATENT DOCUMENTS

| | | | | |
|---|---|---|---|---|
| 5,621,660 | * | 4/1997 | Chaddha et al. | 709/247 |
| 5,745,379 | * | 4/1998 | Lewis | 709/247 |
| 5,748,904 | * | 5/1998 | Huang et al. | 709/247 |
| 5,764,910 | * | 6/1998 | Shachar | 709/223 |
| 5,768,537 | * | 6/1998 | Butter et al. | 709/247 |
| 5,964,842 | * | 10/1999 | Packard | 709/247 |

\* cited by examiner

*Primary Examiner*—Krisna Lim
(74) *Attorney, Agent, or Firm*—Blakely Sokoloff Taylor & Zafman LLP

(57) ABSTRACT

An apparatus is provided with operating logic for performing a number of data compression operations, and control logic for dynamically selecting one or more of the data compression operations, and have the selected data compression operation(s) performed on a set of data, in accordance with a set of scaling policies. In one embodiment the scaling policies are based, at least in part, on processor type and thread backlog. The scaling policies are used to determine compression techniques and combinations to use with data being communicated.

28 Claims, 6 Drawing Sheets

*RLL ENCODING*

DYNAMICALLY SELECTABLE DATA COMPRESSION TECHNIQUES BASED ON PROCESSING CAPACITY

This application is a continuation of Application Ser. No. 08/792,540, filed Jan. 31, 1997, now U.S. Pat. No. 5,964,842 issued on Oct. 12, 1999.

BACKGROUND OF THE INVENTION

1. Field of the Invention

The present invention relates to the field of data compression. More specifically, the present invention relates to the art of dynamically scaling data compression.

2. Background Information

A number of individual lossless and lossy data compression techniques are known in the art. Examples of lossless data compression include Run Length Limited Encoding (RLL), and V.42bis, a standard promulgated by the International Telecommunication Union—Technical Standard Section (ITU-T), whereas examples of lossy data compression include data compression standards promulgated by Moving Picture Engineer Guild (MPEG).

Lossless data compression techniques are known to have been integrated as part of the data communication services offered by a system to all applications, regardless of the nature of the applications, whereas lossy data compression techniques are known to have been integrated as part of device services designed for certain types of applications, e.g. video applications. In the area of data communication, it is also known that some systems supporting multiple data compression techniques are further equipped to negotiate on the specific data compression technique to be employed for a particular data communication session. These negotiations are known to be conducted without regard to the workloads of the respective systems. In other words, there is no attempt to scale the amount of compression to be performed based on the workloads of the communicating systems.

Experience has shown that such ability to dynamically scale the amount of data compression being performed, depending on the workloads of the communicating systems is highly desirable in certain applications, e.g. in the area of network computing. in addition to scalability, experience has also shown that it is desirable to maintain symmetry on the amount of computations required for compression and decompression, as the amount of compression is scaled. In other words, whether it is minimal compression or maximum compression, the amount of computations required for compression and decompression are roughly the same. Furthermore, experience has also shown that it is desirable to exploit certain application characteristics to enhance compression/decompression efficiencies, even for lossless data compression.

In view of these and other desired results, the subject scalable data compression methods and apparatuses are invented.

SUMMARY OF THE INVENTION

An apparatus is provided with operating logic for performing a number of data compression operations, and control logic for dynamically selecting one or more of the data compression operations, and have the selected data compression operation(s) performed on a set of data, in accordance with a set of scaling policies. In one embodiment, the scaling policies include policies that take into account the processing capacity of the apparatus, and the current backlog for processing capacity, and the data compression operations include run length limited encoding of the set of data, differential encoding between current and a preceding set of data, and encoding of data values with cache indices.

In one embodiment, the apparatus is a server serving a number of networked client computing devices, wherein the server is programmed with programming instructions implementing the operating and control logic. The processing capacity is determined using the processor type of the server's processor, and the backlog level is determined using the number of threads waiting for execution.

In one application, the data being compressed are pixel values of display data, the unit of data being analyzed is a line of display data, and the data values cached are the most recently used pixel values.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details. In other instances, well known features are omitted or simplified in order not to obscure the present invention.

Parts of the description will be presented in terms of operations performed by a computer system, using terms such as data, flags, bits, values, characters, strings, numbers and the like, consistent with the manner commonly employed by those skilled in the art to convey the substance of their work to others skilled in the art. As well understood by those skilled in the art, these quantities take the form of electrical, magnetic, or optical signals capable of being stored, transferred, combined, and otherwise manipulated through mechanical and electrical components of the computer system; and the term computer system include general purpose as well as special purpose data processing machines, systems, and the like, that are standalone, adjunct or embedded.

Various operations will be described as multiple discrete steps in turn in a manner that is most helpful in understanding the present invention, however, the order of description should not be construed as to imply that these operations are necessarily order dependent, in particular, the order of presentation.

Figure 1:
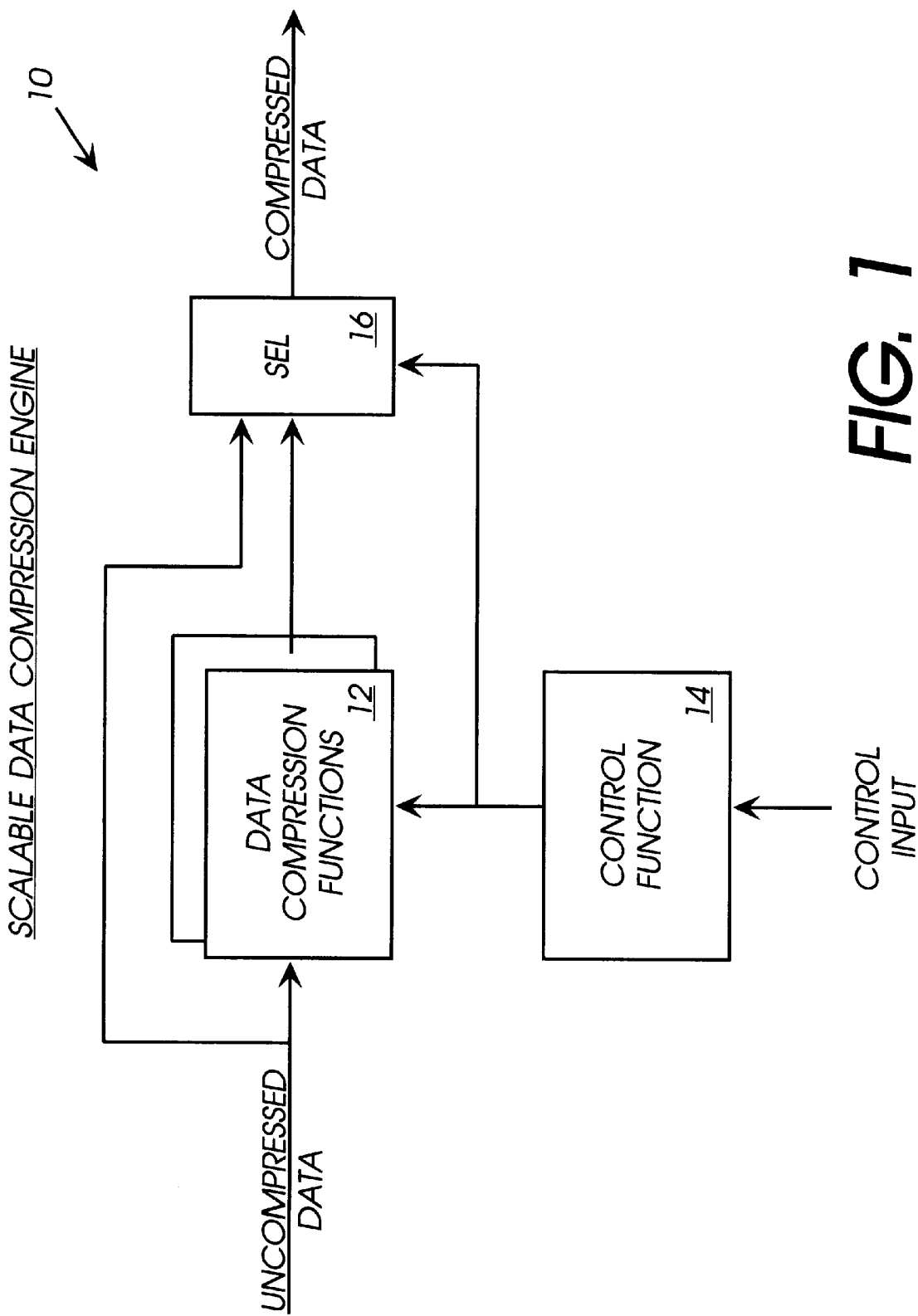
FIG. 1 illustrates one embodiment of the scalable data compression engine of the present invention.

Referring now to FIG. 1, wherein one embodiment of the scalable data compression engine of the present invention is shown. As illustrated, scalable data compression engine 10 comprises a number of data compression functions 12 and control logic, which for the illustrated embodiment, includes control function 14, and selection function 16. Data compression functions 12 are used to incrementally perform a number of data compression operations on a set of data. Control logic dynamically selects which if any of the data compression operations are performed on the data, in accordance with a set of scaling policies.

Figure 2:
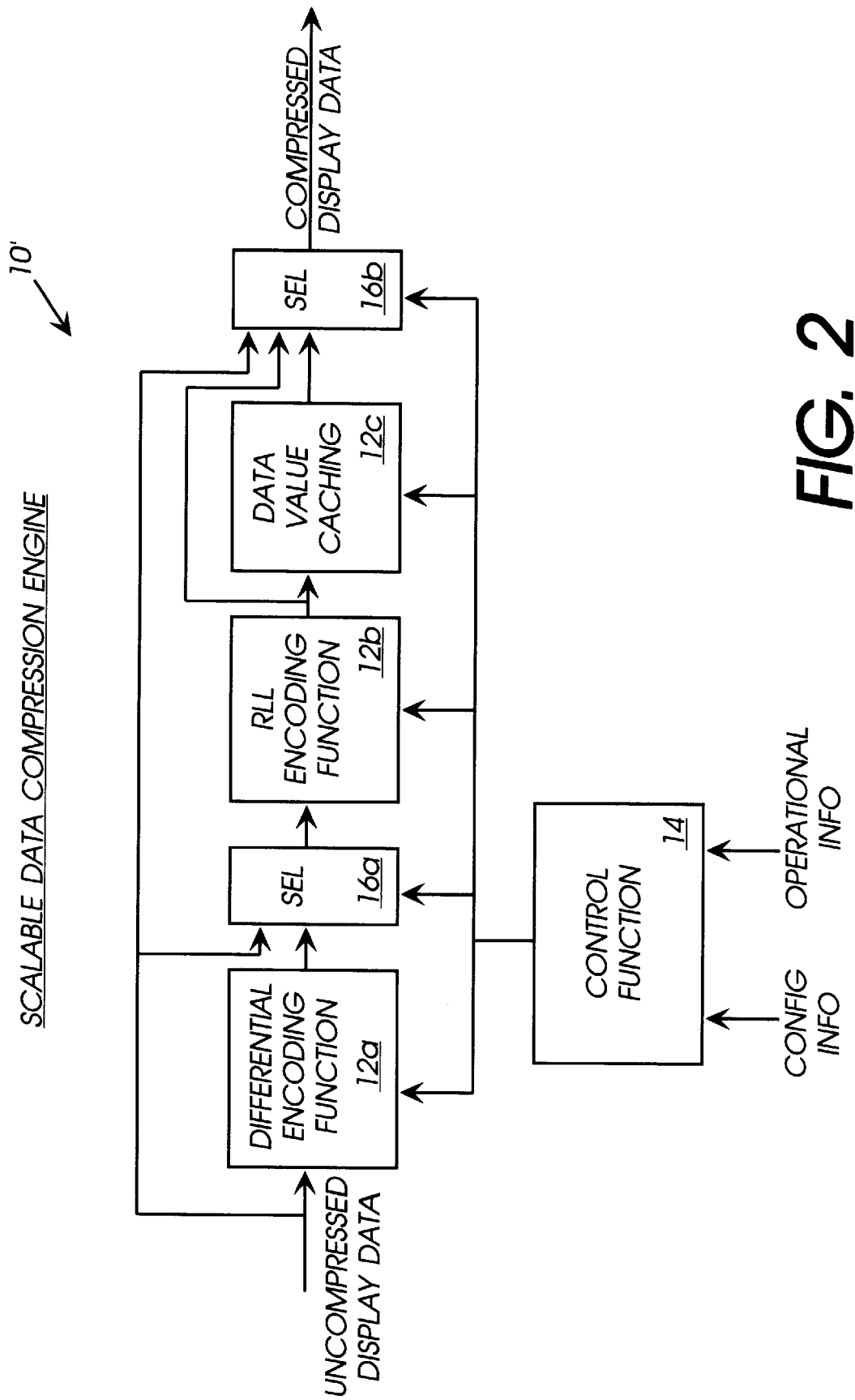
FIG. 2 illustrates a more detailed embodiment of the scalable data compression engine of FIG. 1.

FIG. 2 illustrates a more detailed embodiment of scalable data compression engine 10'. For the illustrated embodiment, data compression functions 12 include particularized differential encoding function 12a, streamlined run length limited (RLL) encoding function 12b, and data value caching 12c, whereas selection logic 16 includes selection logic 16a and 16b. These elements 12a–12c and 16a–16b cooperate with each other, and with control function 14 as shown. In other words, for the illustrated embodiment, in accordance with a set of scaling policies, control logic can cause either no encoding to be performed on a set of data, or RLL encoding to be performed on the set of data, with or without data value caching, or differential and RLL encoding to be performed on the set of data, with or without data value caching.

While not illustrated, those skilled in the art will appreciate that additional selection logic may be provided such that control logic may cause differential encoding to be performed on the set of data, with or without data value caching. Furthermore, those skilled in the art will also appreciate that additional complementary data compression operations may be provided to work in conjunction with differential encoding, RLL encoding, and/or data value caching on a selective basis.

As will be readily apparent from the description to follow, scalable data compression engine 10' is especially suitable for compressing display data consisting of pixel values. For ease of understanding, the remaining description of the present invention will be presented in the context of compressing display data, i.e., pixel values, and data value caching will simply be referred to as pixel value caching. However, those skilled in the art will appreciate that the present invention is not limited to display data, and may be practiced on a variety of other data.

Figure 3:
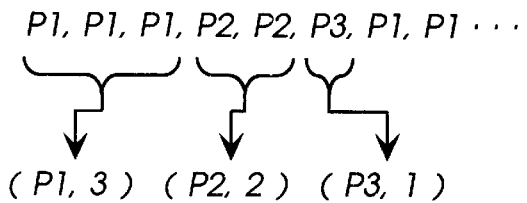
FIG. 3 illustrates pixel values that are encoded into a 2-tuple according to run length limited encoding.
Figure 4:
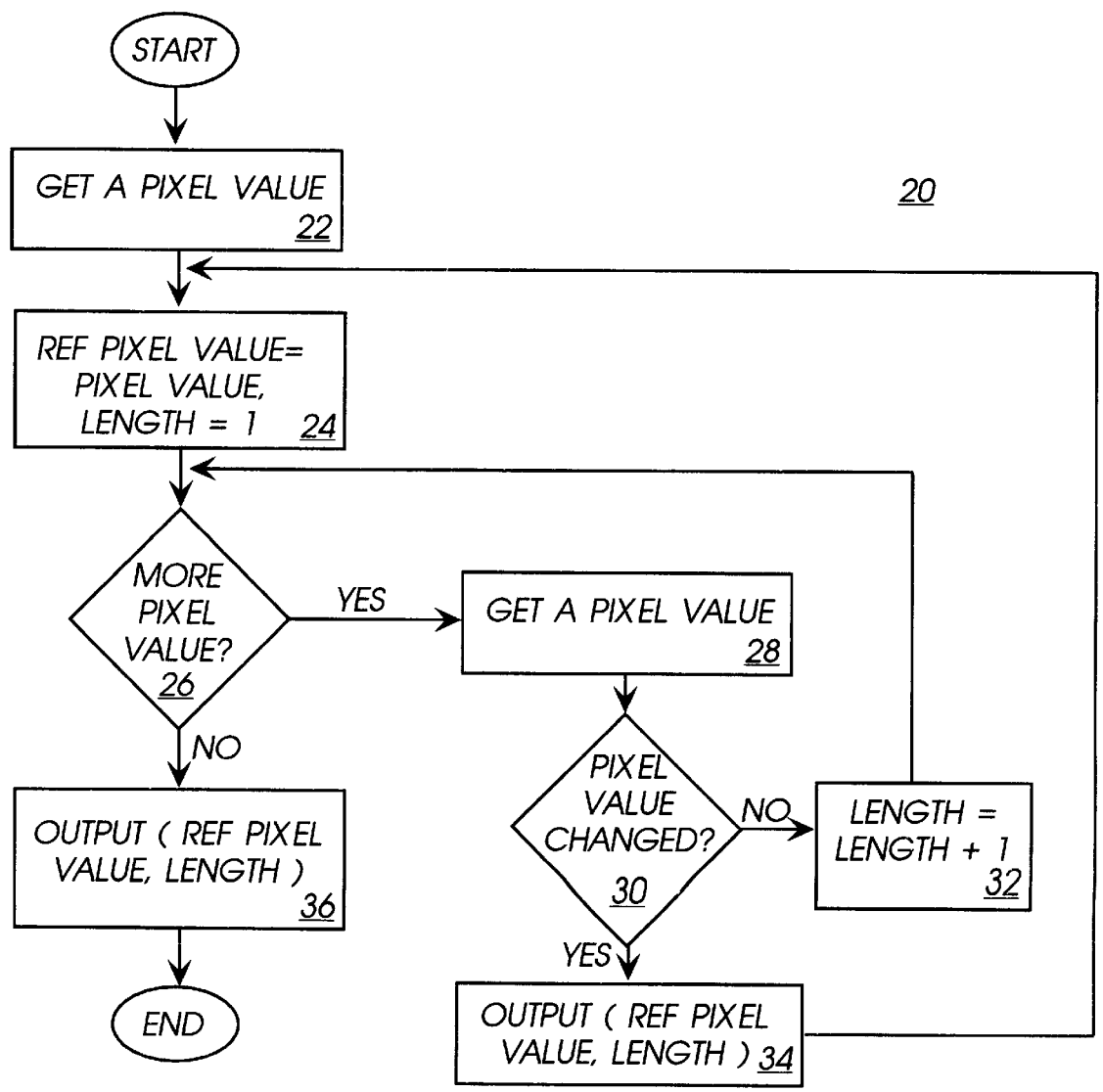
FIG. 4 illustrates a flow diagram for encoding pixel values according to run length limited encoding.

FIGS. 3–4 illustrate a streamlined embodiment of the RLL encoding function 12b of scalable data compression engine 10'. For the streamlined embodiment, as shown in FIG. 3, consecutive pixel values that are identical are encoded into a 2-tuple pair consisting of the pixel value and the run length of the pixel value. For example, for the illustrated sequence of pixel values P1, P1, P1, P2, P2, P3, . . . , the sequence will be encoded as (P1, 3), (P2, 2), (P3, 1) and so forth. Encoding of the three consecutive P1s as (P1, 3) results in almost ⅔ reduction in the number of bits that need to be transmitted, whereas encoding of the two consecutive P2s as (P2, 2) result in almost ½ reduction in the number of bits that need to be transmitted. Obviously, the longer the run, the larger the amount of data reduction will be achieved. Those skilled in the art will recognize that encoding of singular P3 as (P3, 1) actually results in increase in the amount of data that need to be transmitted, and such encoding is not performed in conventional RLL encoding. However, the encoding is performed to streamline the number of encoding formats employed, and facilitate closer cooperation with the other data compression functions, which will be readily apparent from the description to follow.

As shown in FIG. 4, initially, RLL encoding function 12b obtains a first pixel value, step 22. Then, a reference pixel value is set to equal the obtained pixel value, and a length count is initialized to one, step 24. Next, RLL encoding function 12b determines if there are additional pixel values, step 26. If the determination is affirmative, RLL encoding function 12b obtains the next pixel value, step 28, and determines if the newly obtained pixel value has changed, using the reference value, step 30. If the pixel value has remained unchanged, RLL encoding function 12b simply increases the run length by one, step 32, and continues at step 26. On the other hand, if the pixel value has changed, RLL encoding function 12b outputs the 2-tuple pair for the current reference pixel value, using the current length, step 34, and then continues the process at step 24. Eventually, RLL encoding function 12b will determine at step 26 that there are no more pixel values to process. At such time, RLL encoding function 12b outputs the last 2-tuple pair encoding, and terminates the data compression operation, i.e., the encoding.

Figures 5, 6:
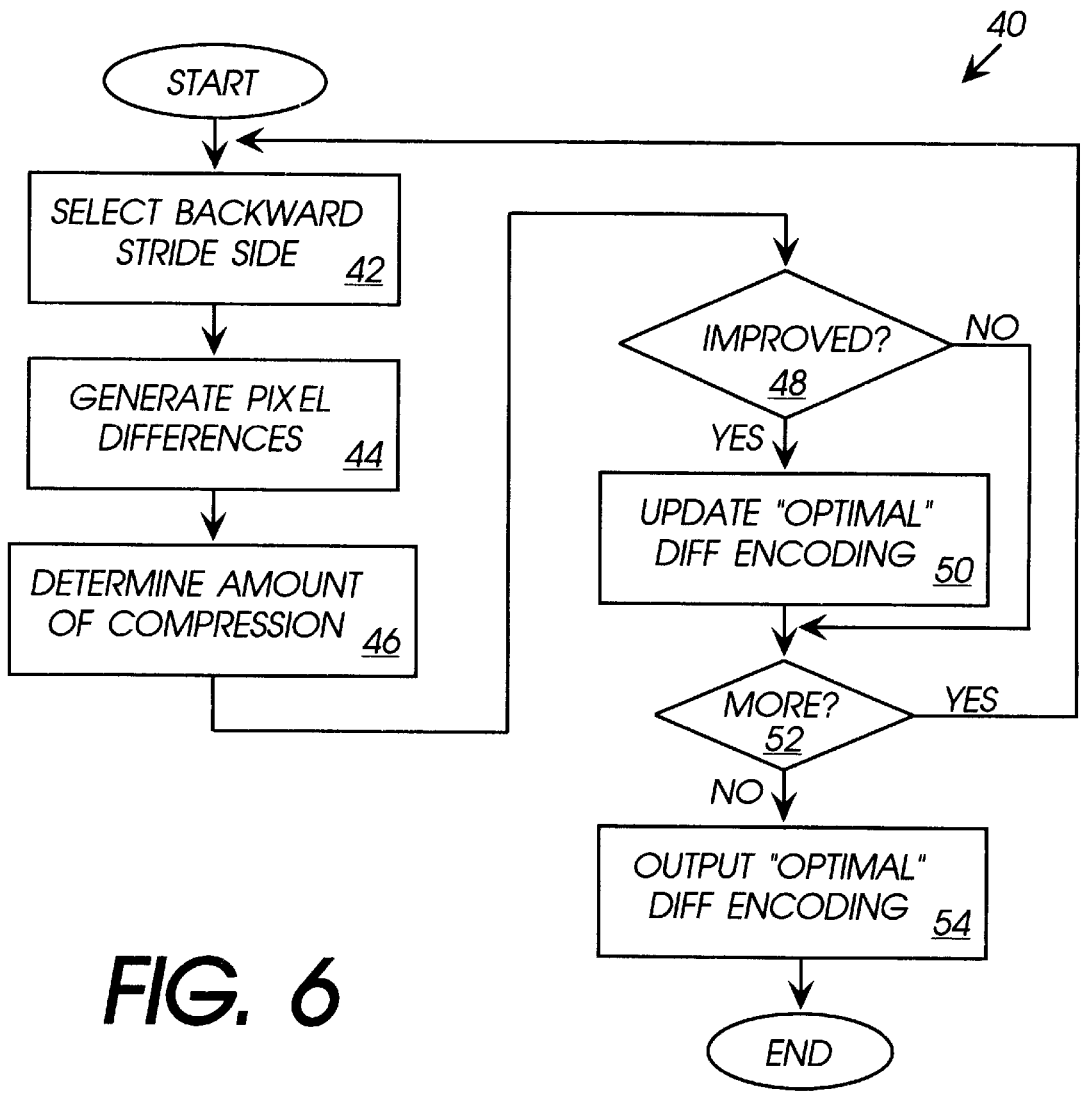
FIG. 5 illustrates pixel values that are encoded according to differential encoding.
FIG. 6 illustrates a flow diagram for encoding pixel values according to differential encoding.

FIGS. 5–6 illustrate a particularized embodiment of the differential encoding function 12a of scalable data compression engine 10'. For the particularized embodiment, as shown in FIG. 5, pixel values of a line (x) of display data are differentially encoded referencing pixel values of an optimal one of a number of preceding lines of display data. The differential encoding is generated by performing an XOR operation on the corresponding pixel values of the "current" line and the reference line. In one embodiment, the preceding lines of display data from which the optimal reference line is chosen are the immediate (x–1), the 4th (x–4) and the 8th (x–8) preceding lines of display data. In general, the reference lines employed to select the optimal reference line is application dependent. For the illustrated example, the optimal reference line is chosen from the immediate, the 4th, and the 8th preceding lines, because the present invention is being used in conjunction with an application that uses 4 pixel by 4 pixel dithering. Thus, there is a high likelihood that the differential encoding will result in identical encoding values, for example, all zeros (which stand for no differences, i.e., all pixel values are identical). When combined with RLL encoding, an entire line of display data can simply be encoded with a single 2-tuple representation of (an encoding value and line length). For a line length of 128 pixel values, the composite encoding results in almost 99% reduction in the amount of data that need to be transmitted.

As shown in FIG. 6, initially, differential encoding function 12a selects a first backward stride size (d0), step 42. As described earlier, for the embodiment illustrated in FIG. 5, the first backward stride size (d0) is one. Differential encoding function 12a then generates the difference values for the corresponding pixel values of the current and the reference lines, step 44. Then, differential encoding function 12a determines a measure of compression, step 46. For the illustrated embodiment, differential encoding function 12a determines the amount of compression, i.e, data reduction, achieved. Next, differential encoding function 12a determines if the amount of compression has improved, step 48. For the illustrated embodiment, that is whether the amount of data reduction has increased. By definition, the amount of compression always improved for the first reference line, i.e. the immediately preceding line. In general, if improvement is detected for the amount of compression, differential encoding function 12a updates its record of the reference line that yields the most compact compression, step 50, otherwise, differential encoding function 12a skips step 50. At step 52, differential encoding function 12a determines if more differential encoding are to be attempted. If the determination is affirmative, differential encoding function 12a returns to step 42 and selects a new backward stride size (d1, next time d2, etc.). For the embodiment illustrated in FIG. 5, the second backward stride will be four. The process then continues as described earlier. On the other hand, if the determination at step 52 is negative, the differential encoding function 12a simply outputs the noted "optimal" differential encoding, step 54. In one embodiment, if more than 1 to 4 data reduction has been achieved, no further differential encoding will be attempted, i.e., the determination is negative. In one embodiment, a history is also maintained for the potential reference lines as to when each of the reference lines was last considered as well as last used. If a potential reference line was last used more than 32 lines of display data earlier, the potential reference line would not be considered, unless it has been more than 16 lines since the potential reference line was last considered. Obviously, other threshold values as well as other historical factors may be employed.

While differential encoding function 12a has been described with the selection of backward stride size, and the improvement determination logic integrated, those skilled in the art will appreciate that these "control" logic may be implemented in control function 14 instead. In other words, in an alternate embodiment, differential encoding function 12a may simply perform only the encoding function on a pair of data lines identified by control function 14. The responsibility for choosing the reference line, i.e. selection of the backward stride size, improvement determination and so forth, is that of control function 14.

Figure 7:
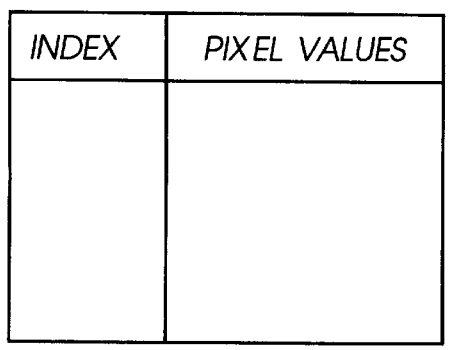
FIG. 7 illustrates one embodiment of pixel value caching.

FIG. 7 illustrates one embodiment of pixel value caching 12c of scalable data compression engine 10'. As shown, pixel value caching 12c includes array 60 for storing a number of the most recently used pixel values and their corresponding index values, e.g. I0 for P0, I1 for P1 etc. Experience has shown that only a relatively small number of most recently used pixel values are needed to yield a high percentage of cache hit. In one embodiment, 15 most recently used pixel values and one encoding denoting none of the cached pixel values are useful are cached, using 4-bit index value. Thus, for the embodiment, for each 24-bit pixel value that needs to be transmitted, a bit reduction of another 80% is achieved. For the illustrated embodiment, array 60 is maintained in a least recently used (LRU) manner. Any one of a number of LRU techniques known in the art may be employed. As will be appreciated by those skilled in the art, the LRU control information may be stored in array 60 also, or kept separately. As will be also appreciated by those skilled in the art, pixel value caching 12c may be used in conjunction with RLL encoding 12b and/or differential encoding 12a.

Figure 8:
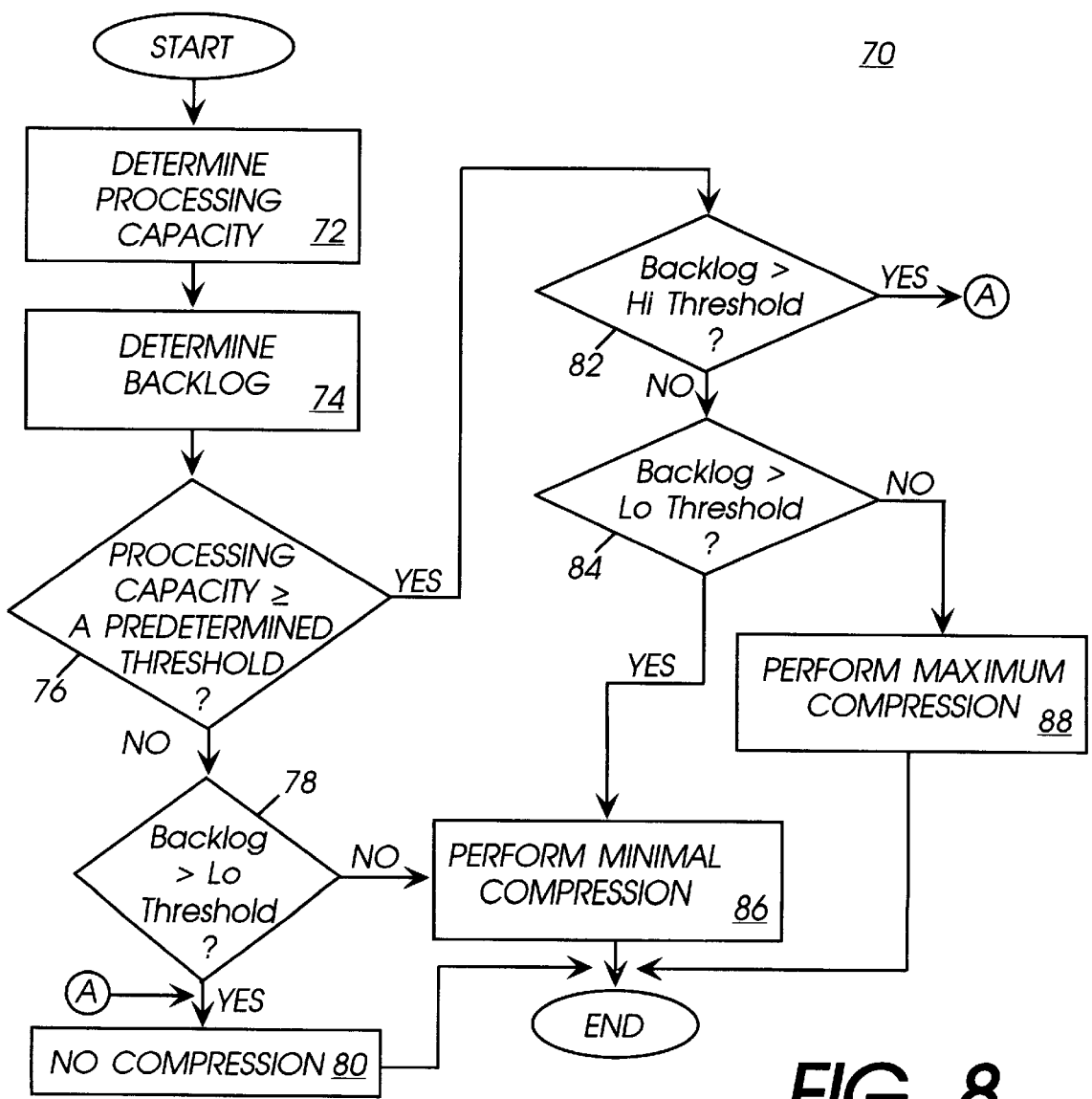
FIG. 8 illustrates one embodiment of the operational steps of control function of FIG. 1.

FIG. 8 illustrates one embodiment of control function 14. As shown, for the illustrated embodiment, control function 14 first determines the processing capacity of the system, step 72. In one embodiment, the determination is performed by ascertaining the processor type of the system's processor. Next, control function 14 determines the volume of processing backlog on the system, step 74. In one embodiment, an embodiment that supports multi-thread execution, the volume of processing backlog is determined by ascertaining the number of threads awaiting execution by the processor.

Upon gathering these control inputs, i.e., processor capacity and processing backlog for the illustrated embodiment, control function 14 determines if the processing capacity is greater than a predetermined threshold, step 76. In the embodiment that employs processor type as a measure of processor capacity, the determination is made in accordance with the processor type is of a type that is rated with a higher performance rating than a predetermined processor type. If the determination is affirmative, control function 14 continues at step 82, otherwise control function 14 continues at step 78.

At step 78, control function 14 further determines if the processing backlog is greater than a first predetermined threshold, for the illustrated embodiment, a "low" threshold. In the above described multi-thread embodiment, the "low" threshold is equal to four threads waiting for processing. If the processing backlog exceeds the "low" threshold, control function 14 causes no data compression to be performed, step 80. If the processing backlog is below the "low" threshold, control function 14 causes minimal data compression to be performed, step 86. In one embodiment, control function 14 causes only RLL encoding 12b to be performed on the data.

At step 82, control function 14 determines if the processing backlog is greater than a second predetermined threshold, for the illustrated embodiment, a "high" threshold. In the above described multi-thread embodiment, the "high" threshold is equal to ten threads waiting for processing. If the processing backlog exceeds the "high" threshold, control function 14 continues at step 80, that is no data compression will be performed on the data. If the processing backlog is below the "high" threshold, control function 14 determines if the processing backlog is greater than the first predetermined threshold, i.e., the "low" threshold. If the processing backlog exceeds the "low" threshold, control function 14 causes minimal data compression to be performed, step 86, otherwise control function 14 causes maximum data compression to be performed, step 88. In one embodiment, control function 14 causes differential encoding 12a, RLL encoding 12b and pixel value caching 12c to be performed on the data.

As described earlier, when RLL encoding 12b is employed without pixel value caching 12c, pixel values are encoded as (pixel value, length), whereas when RLL encoding 12b is employed with pixel value caching 12c, pixel values are encoded as (cache index, length). When differential encoding 12a is also employed, pixel values are encoded as (encoding value, length) if pixel value caching 12c is not employed, and as (cache index, length) if pixel value caching 12c is employed.

While control function 14 has been described with scaling policies that use processor capacity and processing backlog as control inputs, and only two thresholds in conjunction with three actions, those skilled in the art will appreciate that the present invention may be practiced with any number of control inputs of a variety of decision measures, and any number of thresholds coupled with corresponding number of actions.

Figure 9:
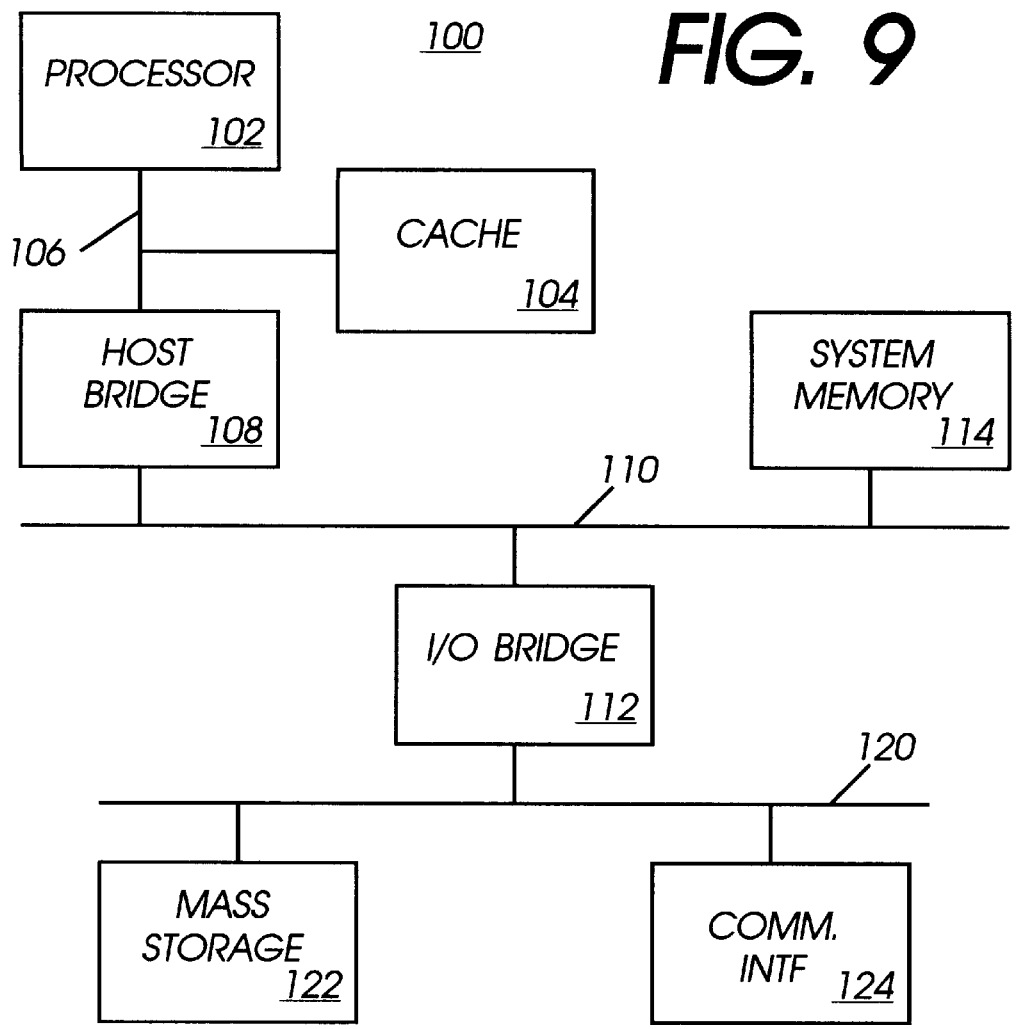
FIG. 9 illustrates one embodiment of a hardware view of a computer system for practicing the present invention.
Figure 10:
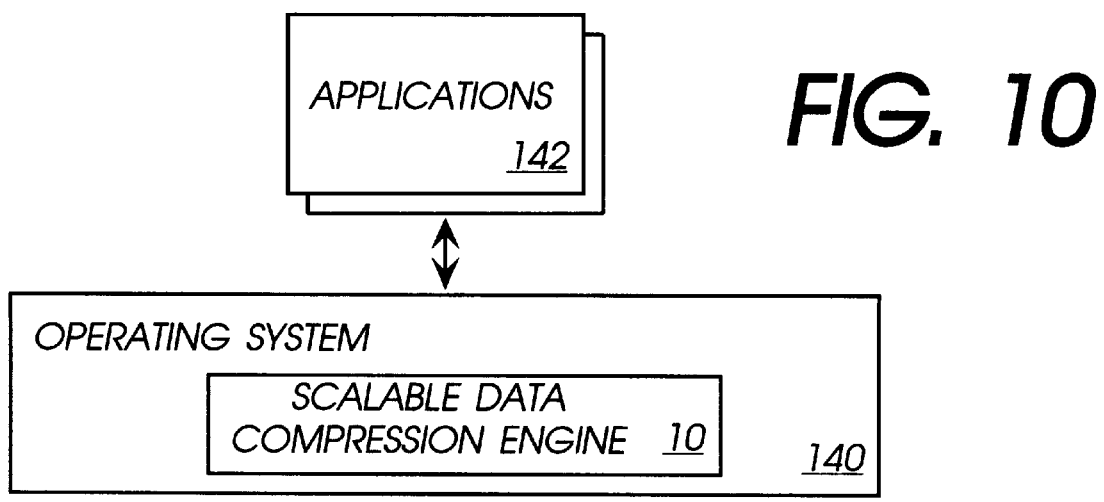
FIG. 10 illustrates one embodiment of a software view of a computer system for practicing the present invention.

FIGS. 9–10 illustrate one embodiment each of a hardware and a software view of a computer system suitable for practicing the present invention. As shown in FIG. 9, for the illustrated embodiment, computer system 100 includes processor 102, processor bus 106, high performance I/O bus 110 and standard I/O bus 120. Processor bus 106 and high performance I/O bus 110 are bridged by host bridge 108, whereas I/O buses 110 and 120 are bridged by I/O bus bridge 112. Coupled to processor bus is cache 104. Coupled to high performance I/O bus 110 is system memory 114. Coupled to standard I/O bus 120 are mass storage 122, and communication interface 124.

These elements perform their conventional functions known in the art, in particular, mass storage 122 and system memory 114 are used to store a permanent and a working copy of a software embodiment of scalable data compression engine 10. The various functions of scalable data compression engine 10 are executed by processor 102 during operation. Communication interface 124 includes in particular a network interface, e.g. an ethernet adapter. Except for the teachings of the present invention, constitutions of these elements are known. Any one of a number of implementations of these elements known in the art may be used to form computer system 100 for practice of the present invention.

As shown in FIG. 10, software components of programmed computer system 100 includes operating system 140, and applications 142. Operating system 140 includes conventional memory management, file management, interprocess communication, and data communication functions. In particular, data communication functions include scalable data compression engine 10 of the present invention. Application 142 are intended to represent a broad category of applications known in the art, including in particular, those applications that use data communication services of operating system 140.

While FIGS. 9–10 illustrate the practice of the present invention in a computer system, those skilled in the art will appreciate that the present invention may be practiced in the context of other apparatuses, in hardware as well as software embodiments. In particular, those skilled in the art will appreciate that the present invention is not limited to the embodiments described. The present invention can be practiced with modification and alteration within the spirit and scope of the appended claims. Accordingly, the description is to be regarded as illustrative instead of restrictive on the present invention.

Thus, a number of scalable data compression methods and apparatuses have been described.

What is claimed is:

1. An apparatus comprising:
    a data compression circuit to perform one or more data compression operations on a set of data; and
    a control circuit coupled to the data compression circuit to dynamically select a data compression operation(s) from the one or more data compression operations to be performed on the set of data, in accordance with a set of data compression scaling policies based, at least in part, on current processing capacity of the apparatus.

2. The apparatus as set forth in claim 1, wherein the data compression operations include run length limited encoding of the set of data.

3. The apparatus as set forth in claim 2, wherein the data compression operations further include differential encoding of the set of data.

4. The apparatus as set forth in claim 3, wherein the set of data comprises a plurality of lines of data, and the differential encoding of the set of data includes differential encoding of a current line of data referencing one or more preceding lines of data.

5. The apparatus as set forth in claim 3, wherein the set of data comprises a plurality of lines of display data, and the data compression operations further include encoding of pixel values with cache indices.

6. The apparatus as set forth in claim 1, wherein the data compression operations include differential encoding of the set of data.

7. The apparatus as set forth in claim 6, wherein the set of data comprises a plurality of lines of data, and the differential encoding of the set of data includes differential encoding of a current line of data referencing a selected one of one or more preceding lines of data.

8. The apparatus as set forth in claim 6, wherein the set of data comprises a plurality of lines of display data, and the data compression operations further include encoding of pixel values with cache indices.

9. The apparatus as set forth in claim 1, wherein the set of data comprises a plurality of lines of display data, and the data compression operations include encoding of pixel values with cache indices.

10. The apparatus as set forth in claim 1, wherein the apparatus includes a processor coupled to the data compression circuit and to the control circuit, the processor having a processor type, and the set of scaling policies include a scaling policy that factors into consideration the processor type.

11. The apparatus as set forth in claim 1, wherein the set of scaling policies include a scaling policy that factors into consideration current backlog for processing capacity of the apparatus.

12. The apparatus as set forth in claim 11, wherein the apparatus includes a processor and an operating system that supports multi-thread execution, and the set of scaling policies include a scaling policy that factors into consideration number of threads waiting for execution.

13. An apparatus comprising:
    a storage medium having stored therein a plurality of programming instructions implementing multiple data compression operations, and a control function that dynamically selects one or more of the data compression operations, and have the selected data compression operation(s) performed on a set of data, in accordance with a set of data compression scaling policies based, at least in part, on current processing capacity of the apparatus; and
    an execution unit coupled to the storage medium to execute the programming instructions.

14. The apparatus as set forth in claim 13, wherein the set of scaling policies include a scaling policy that factors into consideration current backlog for processing capacity of the apparatus.

15. The apparatus as set forth in claim 13, wherein the data compression operations include run length limited encoding of the set of data.

16. The apparatus as set forth in claim 13, wherein the data compression operations include differential encoding of the set of data.

17. The apparatus as set forth in claim 13, wherein the set of data comprises a plurality of lines of display data, and the data compression operations include encoding of pixel values with cache indices.

18. A method comprising:
    selecting, dynamically, a level of data compression in accordance with a set of scaling policies based, at least in part, on current processing capacity of an apparatus; and performing one or more data compression operations on a set of data in accordance with the selected level of data compression.

19. The method as set forth in claim 18, wherein selecting a level of data compression in accordance with a set of scaling policies comprises determining current backlog for processing capacity of the apparatus.

20. The method as set forth in claim 18, wherein the set of data comprises a plurality of lines of display data, and performing one or more data compression operations on a set of data in accordance with the selected level of data compression comprises encoding of pixel values with cache indices.

21. The method as set forth in claim 20, wherein performing one or more data compression operations on a set of data in accordance with the selected level of data compression comprises performing run length limited encoding of the set of data.

22. The method as set forth in claim 20, wherein performing one or more data compression operations on a set of data in accordance with the selected level of data compression comprises differential encoding of the set of data.

23. A server designed to serve a number of networked computing devices comprising:

a storage medium having stored therein a plurality of programming instructions implementing a number of data compression operations, and a control function that dynamically selects one or more of the data compression operations, and have the selected data compression operation(s) performed on a set of data, in accordance with a set of data compression scaling policies based, at least in part, on current processing capacity of the server; and an execution unit coupled to the storage medium for executing the programming instructions.

24. The server as set forth in claim 23, wherein the data compression operations include run length limited encoding of the set of data.

25. The server as set forth in claim 23, wherein the data compression operations include differential encoding of the set of data.

26. The server as set forth in claim 23, wherein the set of data comprises a plurality of lines of display data, and the data compression operations include encoding of pixel values with cache indices.

27. The server as set forth in claim 23, wherein the server includes a processor having a processor type, the set of scaling policies include a scaling policy that factors into consideration the processor type of the server's processor.

28. The server as set forth in claim 23, wherein the server comprises a processor and an operating system that supports multi-thread execution, and the set of scaling policies include a scaling policy that factors into consideration the number of threads waiting for execution by the processor.

* * * * *